(12) United States Patent
Wu et al.

(10) Patent No.: US 9,332,626 B1
(45) Date of Patent: May 3, 2016

(54) EUV LIGHT SOURCE AND EXPOSURE APPARATUS

(71) Applicant: Semiconductor Manufacturing International (Shanghai) Corporation, Shanghai (CN)

(72) Inventors: Qiang Wu, Shanghai (CN); Liwan Yue, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/885,375

(22) Filed: Oct. 16, 2015

(30) Foreign Application Priority Data

Oct. 16, 2014 (CN) .......................... 2014 1 0549348

(51) Int. Cl.
| | |
|---|---|
| G02B 17/00 | (2006.01) |
| H01S 3/08 | (2006.01) |
| H05G 2/00 | (2006.01) |
| H01S 3/223 | (2006.01) |
| G03F 7/20 | (2006.01) |

(52) U.S. Cl.
CPC ............ *H05G 2/008* (2013.01); *G03F 7/70033* (2013.01); *H01S 3/2232* (2013.01); *H05G 2/005* (2013.01); *H05G 2/006* (2013.01)

(58) Field of Classification Search
USPC ....... 250/372, 461.1, 504 R; 356/51, 66, 256, 356/508; 359/725, 726, 727, 729, 736, 359/840–850, 896; 372/5, 92, 98, 99, 107, 372/109
See application file for complete search history.

(56) References Cited

U.S. PATENT DOCUMENTS

| | | | | |
|---|---|---|---|---|
| 5,822,066 A | * | 10/1998 | Jeong ................... | G01B 11/255 356/513 |
| 7,869,138 B2 | * | 1/2011 | Mann ..................... | B82Y 10/00 359/726 |
| 8,553,200 B2 | * | 10/2013 | Wolschrijn .......... | G03F 7/70141 355/53 |
| 2001/0048083 A1 | * | 12/2001 | Hagiwara ........... | G03F 7/70025 250/492.22 |
| 2006/0120429 A1 | * | 6/2006 | Murakami ............ | G03F 7/0033 372/107 |
| 2010/0127191 A1 | * | 5/2010 | Partlo ..................... | H05G 2/008 250/504 R |
| 2012/0224186 A1 | * | 9/2012 | Hetzler ................ | G02B 13/143 356/508 |
| 2013/0327963 A1 | * | 12/2013 | Lambert .................. | G21K 5/04 250/504 R |
| 2016/0004164 A1 | * | 1/2016 | Ruoff .................. | G03F 7/70075 355/71 |

* cited by examiner

*Primary Examiner* — Bernard Souw
(74) *Attorney, Agent, or Firm* — Anova Law Group, PLLC (57) ABSTRACT

An extreme ultraviolet (EUV) light source is provided. The EUV light source comprises a spray nozzle array having a plurality of spray nozzles configured to spray a plurality of rows of droplets to an irradiating position. The EUV light source also includes a laser source having a first reflective mirror and a second reflective mirror configured to generate a first laser beam and a second laser beam, and to cause the first laser beam and the second laser beam to sequentially bombard the plurality of droplets arriving at the irritating position to generate EUV light with increased output power. Further, the EUV light source includes a light focusing device a light focusing device comprising a first partial focusing mirror and a second partial focusing mirror configured to perform a rotating scanning to collect EUV light and focus the collected EUV light at a central focusing point.

20 Claims, 6 Drawing Sheets

EUV LIGHT SOURCE AND EXPOSURE APPARATUS

CROSS-REFERENCES TO RELATED APPLICATIONS

This application claims the priority of Chinese patent application No. 201410549348.6, filed on Oct. 16, 2014, the entirety of which is incorporated herein by reference.

FIELD OF THE INVENTION

The present invention generally relates to the field of semiconductor manufacturing technology and, more particularly, relates to EUV light sources, methods for generating EUV light and exposure apparatus.

BACKGROUND

Photolithography is one of the important steps in the semiconductor manufacturing processes, which utilizes an exposure process and a developing process to form patterns in photoresist. With the continuous increase of the integration level of IC chips, the critical dimension of features be formed by a photolithography process has become smaller and smaller.

The resolution (R) of an exposure apparatus determines the minimum critical dimension of the features formed by a photolithography process. The resolution of an exposure apparatus is presented as an equation: $R=K\lambda/(NA)$, wherein "K" refers to a coefficient related an exposure process; "$\lambda$" refers the wavelength of the exposure light; and "NA" refers to the numerical aperture of the optical system of the exposure apparatus. According to such an equation, there are two approaches to increase the resolution of the exposure apparatus: increasing the numerical aperture of the optical system; and/or reducing the wavelength of the exposure light.

A lot of efforts have been made onto increasing the numerical aperture of the optical system of the exposure apparatus. However, because the next generation photolithography technique has strict requirement for the minimum critical dimensional, it often requires the optical system to have a large numerical aperture. Thus, it may cause the manufacturing and modulating of the optical system to be complex; and further, increasing the numerical aperture may have a significant limitation on the focus depth of the optical system.

Therefore, the other approach, reducing the wavelength of the exposure light, has been deployed to increase the resolution of the exposure system. Extreme ultraviolet (EUV) light source is a recently developed light source. The wavelength of the EUV light source is approximately 13.5 nm, or shorter. When the EUV light source is used in an exposure system, the critical dimension of the formed features may be substantially small. The mainstream method for generating EUV is Laser Produced Plasma (LPP). The principle of LPP is to bombard a target made of Sn to generate plasma; and the plasma radiates ultraviolet light.

Figure 1:
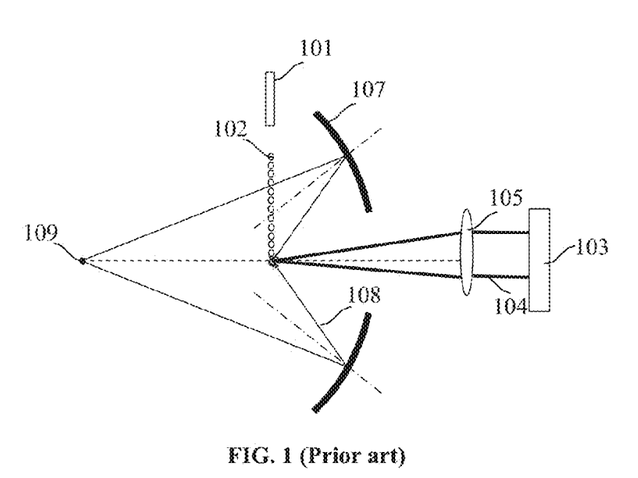
FIG. 1 illustrates an existing EUV light source.

FIG. 1 illustrates an existing EUV light source. As shown in FIG. 1, the EUV light source includes a Sn spray nozzle 101. The Sn spray nozzle 101 sprays Sn droplets 102 downwardly. The EUV light source also includes a laser source 103. The laser source 103 generates a laser beam 104. The laser beam 104 is focused by the lens unit 105; and bombards the Sn droplets 102. The bombarded Sn droplets 102 generates plasma; and the plasma radiates EUV 108. Further, the EUV light source also includes a sing-piece focusing mirror 101. The focusing mirror 101 collects the radiated EUV light 108; and further focuses the collected EUV light 108 at a central focusing point 109.

However, the power of the EUV light generated by such EUV light source is relative low, and it may be unable to match the manufacturing requirements. The disclosed EUV light source and exposure apparatus and other aspects of the present disclosure are directed to solve one or more problems set forth above and other problems.

BRIEF SUMMARY OF THE DISCLOSURE

One aspect of the present disclosure includes an extreme ultraviolet (EUV) light source. The EUV light source comprises a spray nozzle array having a plurality of spray nozzles configured to spray a plurality of rows of droplets to an irradiating position. The EUV light source also includes a laser source having a first reflective mirror and a second reflective mirror configured to generate a first laser beam and a second laser beam, and to cause the first laser beam and the second laser beam to sequentially bombard the plurality of droplets arriving at the irritating position to generate EUV light with increased output power. Further, the EUV light source includes a light focusing device comprising a first partial focusing mirror and a second partial focusing mirror configured to perform a rotating scanning to collect EUV light and focus the collected EUV light at a central focusing point.

Another aspect of the present disclosure includes a method for generating EUV light. The method spraying a plurality of droplets downwardly to an irradiating position through a spray nozzle array having a plurality of spray nozzles; performing a scanning using a laser beam including a first laser beam and a second laser beam reflected by a first reflective mirror and a second reflective mirror to sequentially bombard the droplets arriving at the irradiating position to generate EUV light from each of the plurality of droplets; and collecting and focusing the EUV light at a central focusing point with an increase output power using a light focusing device comprising a first partial focusing mirror and a second partial focusing mirror.

Another aspect of the present disclosure includes an exposure apparatus. The exposure apparatus includes a base; an EUV light source comprising a plurality of spray nozzles for sequentially spraying a plurality of droplets and a light focusing device comprising a first partial focusing mirror and a second partial focusing mirror configured as a exposure light source for a photolithography process; a wafer stage configured to hold a wafer for forming patterns by the photolithography process; a reticle stage for holing a reticle for the photolithography process; and a control unit configured to control the exposure apparatus to perform the photolithography process.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The power of the EUV light generated by the EUV light source illustrated in FIG. 1 is relatively low. For example, the power may be in a range of approximately 10 W~30 W. In a practical photolithography process, the required power may be up to approximately 250 W. Thus, the EUV light generated by the EUV light source illustrated in FIG. 1 is unable to match the practical requirements.

Referring to FIG. 1, the Sn droplets 102 sprayed from the Sn spray nozzle 101 is mechanically controlled such that the adjacent Sn droplets 102 are spatially separated. By doing so, the focused laser beam 104 may be able to bombard each of the Sn droplets 102. When each of the Sn droplets 102 is bombarded, plasma may be generated; and the plasma may irradiate EUV light. If the distance between two adjacent Sn droplets 102 is substantially small, and/or two Sn droplets 102 stick together, when the focused laser beam 104 bombards the problematic Sn droplets 102, fragment plasma may be generated; and the fragment plasma may affect following Sn droplets 102. Thus, the bombardment effect of the focused laser beam 104 may be impaired; and/or it may be difficult to accumulate and focus the irradiated EUV light. Therefore, the power of the EUV light source may be adversely affected.

To ensure the completeness of each drop of the Sn droplets 102; and to cause adjacent Sn droplets 102 to have a desired distance, the spray frequency of the mechanically controlled spray nozzle 101 may be approximately 100 kHz. Thus, the number of the Sn droplets 102 sprayed per unit time may be limited. In another word, the number of the Sn droplets 102 bombarded by the focused laser beam 104 may be limited. Thus, the quantity of the plasma generated by the bombarded Sn droplets 102 and the quantity of the EUV light irradiated by the plasma may be limited. Ultimately, the quantity of the EUV light focused at the central focusing point 109 may be limited. Thus, the power of the EUV light focused at the central focusing point 109 may be relatively low.

Figure 2:
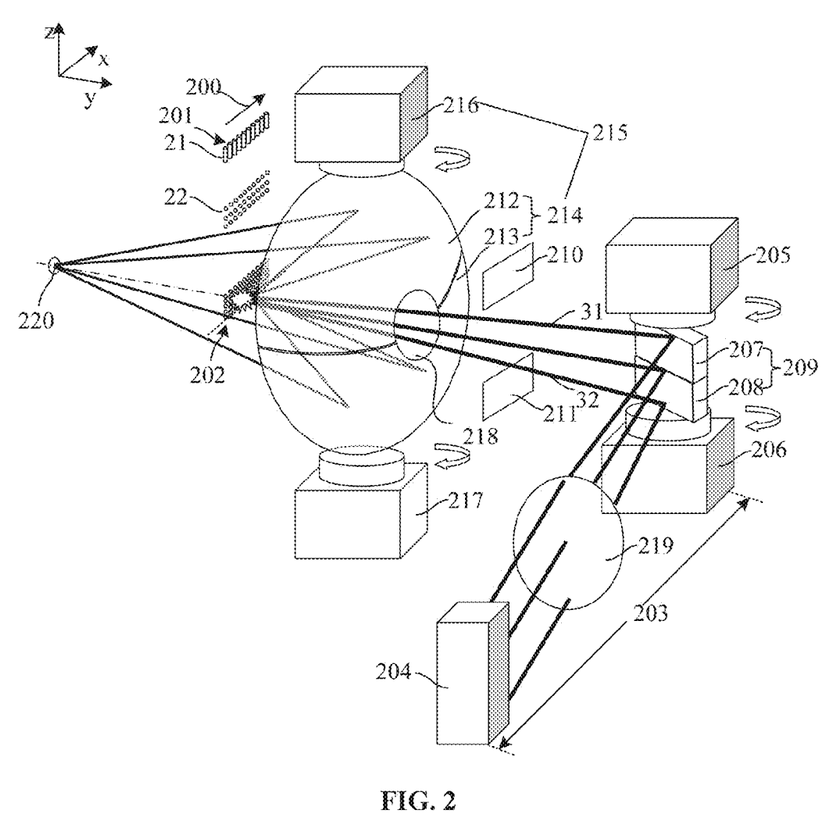
FIG. 2 illustrates an exemplary EUV light source according to the disclosed embodiments.

FIG. 2 illustrates an exemplary EUV light source according to the disclosed embodiments. As shown in FIG. 2, the EUV light source may include a spray nozzle array 201. The spray nozzle array 201 may include a plurality of spray nozzles 21 distributed along a scanning direction 200. The plurality of spray nozzles 21 may be configured to spray droplets 22 downwardly to an irradiating position 202. The scanning direction may refer to a direction parallel to the x-axis. The irradiating position 202 may referred to a position at which a laser beam may bombard the droplets 22 to irradiate EUV light.

Further, the EUV light source may also include a laser source 203. The laser source 203 may be configured to generate a first laser beam 31 and a second laser beam 32; and may cause the first laser beam 31 and the second laser beam 32 to scan along the scanning direction 200. The first laser beam 31 and the second laser beam 32 may alternately bombard the droplets 22 at the irradiating position 202 during the scanning process. The droplets 22 may generate plasma when being bombarded by the first laser beam 31 and the second laser beam 32; and the plasma may irradiate EUV light.

Further, the EUV light source may also include a light focusing device 215. The light focusing device 215 may comprise a focusing mirror 214; and the focusing mirror 214 may have an elliptical surface. The light focusing device 215 may be configured to collect irradiated EUV light and focus the collected EUV light at a central focus point 220.

Further, the EUV light source may also include a droplet material supply chamber (not shown). The droplet material supply chamber may be configured to store the material of the droplets 22. The plurality of spray nozzles 21 of the spray nozzle array 201 may be connected with the droplet material supply chamber by certain interconnect tubes (not shown); and the material stored in the droplet material supply chamber may be sprayed out from the spray nozzles 21 to form the droplets 22. In certain other embodiments, the droplet material supply chamber may be more than one; and each of the plurality of spray nozzles 21 may be connected with a corresponding droplet material supply chamber by a certain interconnect tube.

The spray nozzle array 201 may also include a plurality of switches (not shown) corresponding to the plurality of spray nozzles 21. Each of the plurality of switches may control a corresponding spray nozzle 21 to spray, or not to spray droplets 22. The switches may be disposed in the interconnect tube between the spray nozzles 21 and the droplet material supply chamber. By controlling on/off of the switches, the material stored in the droplet material supply chamber may be feed to the spry nozzles 21 with pre-determined intervals through the interconnect tube. Thus, the droplets 22 may be sprayed to the irradiating position 202.

The switches may be signal-controlled mechanical switches. That is, the on/off status of the switches may be controlled by electrical signals; and the spray nozzles 21 may be controlled to spray, or not to spray droplets 22 downwardly. In one embodiment, the switches are electronic extruding switches.

The droplets 22 may be made of any appropriate material, such as Sn, Sn alloy, Sn compounds, Xe, or Li, etc. The Sn compounds may include SnBr4, SnBr2, and SnH4, etc. The Sn alloy may include SnGa alloy, SnIn alloy, or SnInGa alloy, etc.

The material of the droplets 22 may determine the temperature of the droplets 22 at the irradiating position 202. The distance between the plurality of spray nozzles 21 and the irradiating position 202 may also determine the temperature of the droplets 22 at the irradiating position 202; and may be designed according to practical requirements. The number of the spray nozzles 21 may be greater than two.

In one embodiment, the scanning direction 200 may be the direction parallel to the x-axis direction. The irradiating position 202 may be a line (refer to the dashed line) right below the spray nozzle array 201; and parallel to the scanning direction 200. Further, the irradiating position 202 may be corresponding to a first focus point of the elliptical surface of the focusing mirror 214; and the central focus point 220 may be corresponding to the second focus point of the elliptical surface of the focusing mirror 214. When the first focus point is moving along a linear direction parallel to the scanning direction 200, the focusing mirror 214 may perform a rotating scanning to keep the position of the second focus point to be relatively constant. In certain other embodiments, the focusing mirror 214 may scan with other appropriate mode.

Figure 3:
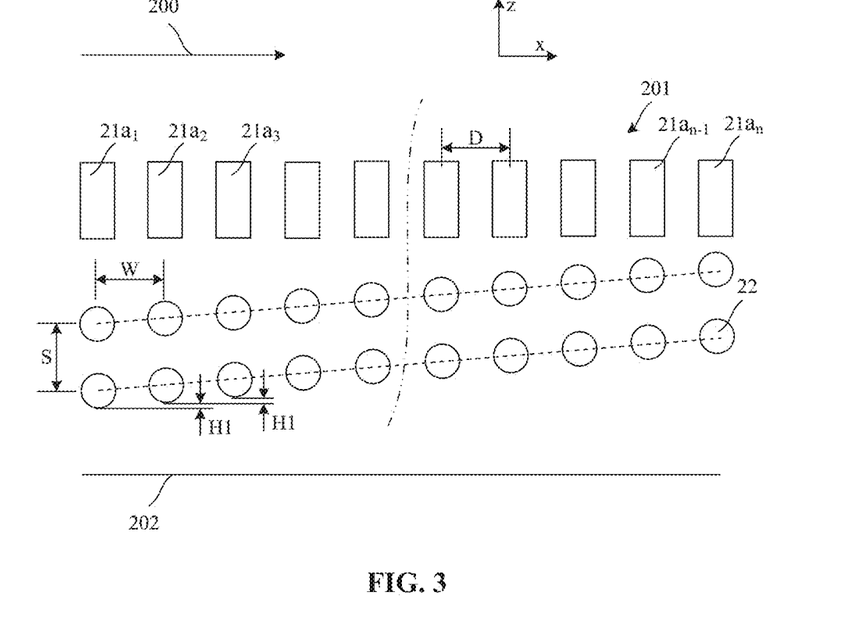
FIGS. 3-4 illustrate certain detailed structures of the EUV light source illustrates in FIG. 2.

FIG. 3 illustrates the detailed structure of the spray nozzle array 201 according to the disclosed embodiments. As shown in FIG. 3, the spray nozzle array 201 may include a plurality of spray nozzles 21 distributed along the scanning direction 200. The plurality of spray nozzles 21 may be sequentially referred as a first spray nozzle $21a_1$, a second spray nozzle $21a_2$, a third spray nozzle $21a_3$, ..., and an Nth spray nozzle $21a_n$, along the scanning direction 200. Being distributed along the scanning direction 200 may refer that a connection line of the centers of the plurality of spray nozzles 21 ($21a1$~$21an$) is parallel to the scanning direction 200.

In one embodiment, the distances (Ds) between the centers of adjacent spray nozzles 21 may be a constant. Thus, when the plurality of spray nozzles 21 may sequentially spray droplets 22 to the irradiating position 202; and the distances (Ws) between adjacent droplets 22 may also be constant (W=D). Thus, when the laser beam scan along the scanning direction 200 to sequentially bombard the droplets 22 at the irradiating position 202, the fragment plasma generated from a current droplet 22 may not affect the bombardment of the next droplet 22. In certain other embodiments, the distances (Ds) between the center of adjacent spray nozzles 21 may be different; and the distances (Ws) between adjacent droplets 22 may also be different.

In one embodiment, the distance between the centers of adjacent spray nozzles 21 may be in a range of approximately 45 μm~75 μm. The size of the droplets 22 may be in a range of approximately 25 μm~35 μm. In one embodiment, the droplets sprayed from the first spray nozzle $21a_1$ may be referred as first droplets; the droplets sprayed from the second spray nozzle $21a_2$ may be referred as second droplets; the droplets sprayed from the second spray nozzle $21a_3$ may be referred as third droplets; ...; and the droplets sprayed from the Nth spray nozzle $21a_n$ may be referred as Nth droplets.

A process for the plurality of spray nozzles ($21a_1$~$21a_n$) sequentially spray droplets 22 to the irradiation position 202 may include: spraying a first droplet (not labeled) through the first spray nozzle $21a_1$; spraying a second droplet (not labeled) through the second spray nozzle $21a_2$ after the first droplet is sprayed for a pre-determined first time duration; spraying a third droplet (not labeled) through the third spray nozzle $21a_3$ after the second droplet was spray with for a pre-determined second time duration; ...; and spraying an Nth droplet (not labeled) through the Nth spray nozzle $21a_n$ after the (N−1)th droplet is sprayed for a pre-determined (N−1) time duration. The first droplet, the second droplet, the third droplet, ... and the Nth droplet may be aligned in a row of droplets 22. In one embodiment, the first time duration, the second time duration, the third time duration ..., and the (N−1)th time duration are same; and may be equal to the first time duration.

Thus, after the first droplet sprayed through the first spray nozzle $21a_1$ arrives at the irradiating position 202 for the first time duration, the second droplet sprayed through the second spray nozzle $21a_2$ may arrive at the irradiating position 202; after the second droplet arrives the irradiating position 202 for the first time duration, the third droplet sprayed through the third spray nozzle $21a_3$ may arrive at the irradiating position 202 ...; and after the (N−1)th droplet sprayed through the (N−1)th spray nozzle $21a_{n-1}$ arrives at the irradiating position 202, the Nth droplet may arrive at the irradiating position 202.

Referring to FIG. 2 and FIG. 3, when the plurality of spray nozzles ($21a_1$~$21a_n$) are spraying the plurality of droplets 22, the laser beam generated by the laser source 203 may scan along the scanning direction 200 to sequentially bombard the first droplet, the second droplet, the third droplet ..., and the Nth droplet arriving at the irradiating position 202. Specifically, after the laser beam generated by the laser source 203 bombards the first droplet 22 at the irradiating position 202, the laser source 203 may cause the laser beam to scan along the scanning direction 200. When the second droplet arrives at the irradiating position 202, the laser beam may bombard the second droplet 22 at the irradiating position 202. Then, the laser source 203 may cause the laser to continue to scan along the scanning direction 200, when the third droplet 22 arrives at the irradiating position 202, the laser beam may bombard the third droplet 22 at the irradiating position 202 .... Then, the laser source 203 may cause the laser beam to continue to scan along the scanning direction 200. When the Nth droplet 22 arrives at the irradiating position 202, the laser beam may bombard the Nth droplet 22 at the irradiating position.

When the first droplet, the second droplet 22, the third droplet 22, ..., and the Nth droplet 22 are sequentially bombarded by the first laser beam 31, plasma may be generated correspondingly. The generated plasma may irradiate EUV light. At the same time, the light focusing device 215 may perform a rotating scan to sequentially collect the EUV light; and focus the collected EUV light at the central focusing point 220.

Specifically, after the light focusing device 215 collects the EUV light generated by bombarding the first droplet and focuses the collected EUV light at the central focusing point 220, the light focusing device 215 may perform a rotating scanning, and collect the EUV light generated by bombarding the second droplet; and focus the collected EUV light at the central focusing point 220. Then, the light focusing device 215 may continue to perform a rotation scanning; and collect the EUV light generated by bombarding the third droplet; and focus the collected EUV light at the central focusing point 220 .... Then, the light focusing device 215 may continue to perform a rotating scanning; and collect EUV light generated by bombarding the Nth droplet; and focus the collected EUV light at the central focusing point 220.

Further, referring to FIG. 3, in one embodiment, a process for the first spray nozzle $21a_1$, the second spray nozzle $21a_2$, the third spray nozzle $21a_3$, ..., and the Nth (N≥3) spray nozzle $21a_n$ of the spray nozzle array 202 to spray droplets 22 downwardly to the irradiating position 202 may include: spraying a first drop of first droplet 22 through the first spray nozzle $21a_1$; spraying a first drop of second droplet 22 through the second spray nozzle $21a_2$ after the first drop of first droplet 22 is sprayed for a first time duration; spraying a first drop of third droplet 22 through the third spray nozzle $21a_3$ after the first drop of second droplet 22 is sprayed for the first time duration; ...; and spraying a first drop of Nth droplet 22 through the Nth spray nozzle $21a_n$ after the first drop of (N−1)th droplet is sprayed for the first time duration.

Further, after the first spray nozzle $21a_1$ sprays the first drop of first droplet 22, a second drop of first droplet 22, a third drop of first droplet 22, a fourth drop of first droplet 22, ..., and an Mth (M≥4) drop of first droplet 22 may be sequentially sprayed through the first spray nozzle $21a_1$ with a time interval of a second time duration. Similarly, after the second spray nozzle $21a_2$ sprays the first drop of second droplet 22, a second drop of second droplet 22, a third drop of second droplet 22, a fourth drop of second droplet 22, ..., and an Mth (M≥4) drop of second droplet may be sequentially sprayed from the second spray nozzle $21a_2$ with a time interval of the second time duration. Similarly, after the third spray nozzle $21a_3$ sprays the first third droplet 22, a second drop of third droplet 22, a third drop of third droplet, a fourth drop of third droplet 22, ..., and an Mth (M≥4) drop of third droplet 22 may be sequentially sprayed for the third spray nozzle $21a_3$ with a time interval of the second time duration ....

Similarly, after the Nth spray nozzle 21*an* sprays the first drop of Nth droplet 22, a second drop of Nth droplet 22, a third drop of Nth droplet 22, a fourth Nth droplet 22, . . . , and an Mth (M≥4) drop of Nth droplet 22 may be sequentially sprayed from the Nth spray nozzle 21$a_n$ with a time interval of the second time duration.

The first drop of first droplet 22, the first drop of second droplet 22, the first drop of third droplet 22, . . . , and the first drop of Nth droplet may form the first row of droplets 22; the second drop of first droplet 22, the second drop of second droplet 22, the second drop of third droplet 22, . . . , and the second drop of Nth droplet may form a second row of droplets 22; the third drop of first droplet 22, the third drop of second droplet 22, the third drop of third droplet 22, . . . , and the third drop of Nth droplet 22 may form the third row of droplets 22; . . . ; and the Mth drop of first droplet 22, the Mth drop of second droplet 22, the Mth drop of third droplet 22, . . . , the Mth drop of Nth droplet may form the Mth row of droplets 22. The adjacent rows of droplets 22 may be parallel.

Such a method for spraying the plurality of rows of droplets 22 may regularly (e.g., adjacent droplets have a constant time interval; and adjacent row of droplets have a constant time interval) and continuously spray droplets 22 to the irradiating position 202. Thus, the supplying quantity of the droplets 22 per unit time may be increased. Further, such a method for spraying the plurality of rows of droplets 22 may also cause laser beam generated by the laser source 203 to regularly scan along the scanning direction 200. Thus, the laser beam may sequentially bombard the droplets 22 at the irritating position 202. Then, the light focusing device 215 may regularly perform a rotating scanning to collect the irradiating EUV light; and focus the collected EUV light at the central focusing point 220. Thus, the power of the EUV light at the central focusing point 220 may be increased.

Further, referring to FIG. 3, the first drop of first droplet 22 and the second drop of first droplet 22 may have a first distance "S"; the first drop of second droplet 22 and the second drop of second droplet 22 may have a first distance "S"; the first drop of third droplet 22 and the second drop of third droplet 22 may have a first distance "S"; . . . ; and the first drop of Nth droplet and the second drop of Nth droplet may have a first distance "S". In one embodiment, the first distance "S" may be in a range of approximately 45 μm~75 μm.

Further, the first drop of first droplet 22 and the first drop of second droplet 22 along the "Z" direction may have a second distance "H1"; the first drop of second droplet 22 and the first drop of third droplet 22 along the "Z" direction may have a second distance "H1"; . . . ; and the first drop of (N−1)th droplet 22 and the first drop of Nth droplet 22 along the "Z" direction may have second distance "H1". The second drop of first droplet 22 and the second drop of second droplet 22 along the "Z" direction may have a second distance "H1"; the second drop of second droplet 22 and the second drop of third droplet 22 along the "Z" direction may have a second distance "H1"; . . . ; and the second drop of (N−1)th droplet 22 and the second drop of Nth droplet 22 along the "Z" direction may have the second distance "H1". The third drop of first droplet 22 and the third drop of second droplet 22 along the "Z" direction may have the second distance "H1"; the third drop of second droplet 22 and the third drop of third droplet 22 along the "Z" direction may have the second distance "H1"; . . . ; and the third drop of (N−1)th droplet 22 and the third drop of Nth droplet 22 along the "Z" direction may have the second distance "H1" . . . . . The Mth drop of first droplet 22 and the Mth drop of second droplet 22 along the "Z" direction may have a second distance "H1"; the Mth drop of second droplet 22 and the Mth drop of third droplet 22 along the Z direction may have the second distance "H1"; . . . ; and the Mth drop of (N−1)th droplet 22 and the Mth drop of Nth droplet along the "Z" direction may have the second distance "H1".

Further, referring to FIG. 2, the laser source 203 may include a laser 204; a reflective mirror 209, and a first driving device (not labeled). The laser 204 may be configured to generate a laser beam. The reflective mirror 209 may configured to reflect the laser beam; and cause the laser beam to irradiate the irradiating position 202. The first driving device may be connected with the reflective mirror 209 to drive the reflective mirror 209 to rotate such that the laser beam reflected by the reflective mirror 209 may scan along the scanning direction 200; and may sequentially bombard the droplets 22 at the irradiating position 202.

The laser 204 may be a pumped laser with a relatively high pulse frequency. Thus, the laser beam may bombard more droplets 22 per unit time. The pumped laser may be Q-switched laser, or a mode-locked laser, etc. In one embodiment, the laser 204 is a $CO_2$ laser. The output power of the laser 204 may be in a range of approximately 10 kW~200 kW.

The pulse irradiation of the laser 204 may synchronize with the spraying of the droplets 22 and the rotating scanning of the reflective mirror 209 and the light focusing mirror 214. By doing so under the control signals from a controller (not shown), when the droplets 22 arrive the irritating position 202, the corresponding laser beam may be able to bombard the droplets 22; and may collect the EUV light irradiated from the droplets 22 and focus the collected EUV light at the central focusing point 220.

Referring to FIG. 2, in one embodiment, the reflective mirror 209 may include a first reflective mirror 207 and a second reflective mirror 208; and the first reflective mirror 207 and the second reflective mirror 208 may be separated. The first driving device may include a first sub-driving device 205 and a second sub-driving device 206. The first reflective mirror 207 may be disposed above the second reflective mirror 208. The first reflective mirror 207 may reflect a portion of the laser beam to form the first laser beam 31. The first sub-driving device 205 may be connected with the first reflective mirror 207. Further, the first sub-driving device 205 may drive the first reflective mirror 207 to rotate to cause the first laser beam 31 to scan along the scanning direction 200 to sequentially bombard the droplets 22 at the irradiating position 202. The second reflective mirror 208 may reflect a portion of the laser beam to form the second laser beam 32. The second sub-driving device 206 may be connected with the second reflective mirror 208. Further, the second sub-driving device 206 may drive the second reflective mirror 208 to rotate to cause the second laser beam 32 to scan along the scanning direction 200 to sequentially bombard the droplets 22 at the irradiating position 202.

The first sub-driving device 205 may be disposed above the first reflective mirror 207; and may be connected with the first reflective mirror 207 by a bearing. The second sub-driving device 206 may be disposed below the second reflective mirror 208; and may be connected with the second reflective mirror 208 by a bearing. The bearings may be electromagnetic bearings, or mechanical bearings, etc.

The first sub-driving device 205 may drive the first reflective mirror 207 by any appropriate methods, such as an electromagnetic drive method, or a piezoelectric drive method. The second sub-driving device 206 may drive the second reflective mirror 208 by any appropriate methods, such as an electromagnetic drive method, or a piezoelectric drive method.

The first sub-driving device 205 and the second sub-driving device 206 may include power supplies (not shown) and driving circuitry (not shown), etc. The power supplies may provide power for driving the first reflective mirror 207 and the second reflective mirror 208 to rotate. The driving circuitry may provide drive signals to the power source. The power supplies may be electric motors, etc.

Further, a lens unit 219 may be disposed in the optical path between the laser 204 and the first reflective mirror 207, and the optical path between the laser 204 and the second reflective mirror 208. The lens unit 219 may be configured to adjust the incident angle of the laser beam to the first reflective mirror 207 and the second reflective mirror 208 when the laser beams generated by the laser 204 irradiate the first reflective mirror 207 and the second reflective mirror 208. The adjustment may cause the first laser beam 31 reflected by the first reflective mirror 207 and the second laser beam 32 reflected by the second reflective mirror 208 to be able to reach the irradiating position 202.

In one embodiment, the first sub-driving device 205 and the second sub-driving device 206 may drive the first reflective mirror 207 and the second reflective mirror 208 to rotate, respectively. The first reflective mirror 207 may reflect a portion of the laser beam to form the first laser beam 31. The second reflective mirror 208 may reflect a portion of the laser beam to form the second laser beam 32. The first laser beam 31 and the second laser beam 32 may alternately bombard different rows of droplets 22 arriving at the irradiating position 202. When the quantity of the droplets 22 supplied by the spray nozzle array 201 per unit time is increased, for example, the second time T2 between adjacent rows of droplets 22 is substantially short, by alternately bombarding the different rows of droplets 22 using the first laser beam 31 and the second laser beam 32, all the droplets 22 arriving at the irradiating position 202 may be bombarded. Thus, the power of the EUV light may be increased.

In one embodiment, a process for the first laser beam 31 and the second laser beam 32 alternately bombarding the different rows of droplets 22 at the irradiating position 202 may include following steps. First, when the Lth (L+1) row of droplets 22 arrive at the irradiating position 202, the first sub-driving device 205 drives the first reflective mirror 207 to rotate from an initial position to cause the first laser beam 31 reflected by the first reflective mirror 207 to scan along the scanning direction 200 to sequentially bombard the Lth row of droplets 22 at the irradiating position 202. After bombarding the Lth row of droplets 22, the first sub-driving device 205 may drive the first reflective mirror 207 back to the initial position. Then, when the (L+1)th row of droplets 22 arrive at the irradiating position 202, the second sub-driving device 206 may drive the second reflective mirror 208 to rotate from an initial position to cause the second laser beam 32 reflected by the second reflective mirror 208 to scan along the scanning direction 200 to sequentially bombard the (L+1)th row of droplets 22. After bombarding the (L+1)th row of droplets 22 arriving at the irradiating position 202, the second sub-driving device 206 may drive the second reflective mirror 208 back to the original position. Then, when the (L+2)th row of droplets 22 arrive at the irradiating position 202, the first sub-driving device 205 may drive the first reflective mirror 207 to rotate from the initial position to cause the first laser beam 31 reflected by the first reflective mirror 207 to scan along the scanning direction 200 to sequentially bombard the (L+2)th row of droplets 22 arriving at the irradiating position 202. After bombarding the (L+2)th row of droplets 22, the first sub-driving device 205 may drive the first reflective mirror 207 back to the initial position. Then, when the (L+3)th row of droplets 22 arrive at the irradiating position 202, the second sub-driving device 206 may drive the second reflective mirror 208 to rotate from the initial position to cause the second laser beam 32 reflected by the second reflective mirror 208 to scan along the scanning direction to sequentially bombard the (L+3)th row of droplets 22. After bombarding the (L+3)th row of droplets 22 at the irradiating position 202, the second sub-driving device 206 may drive the second reflective mirror 208 back to the original position. Such steps may be repeated to generate continuous EUV light.

In certain other embodiments, a process for the first laser beam 31 and the second laser beam 31 alternately bombarding the different rows of droplets 22 at the irradiating position 202 may include following steps. First, when the Lth (L≥1) row of droplets 22 arrive at the irradiating position 202, the second sub-driving device 206 may drive the second reflective mirror 208 to rotate from an initial position to cause the second laser beam 32 reflected by the second reflective mirror 208 to scan along the scanning direction 200 to sequentially bombard the Lth row of droplets 22 at the irradiating position 202. After bombarding the Lth row of droplets 22, the fourth sub-driving device 206 may drive the second reflective mirror 208 back to the initial position. Then, when the (L+1)th row of droplets 22 arrive at the irradiating position 202, the first sub-driving device 205 may drive the first reflective mirror 207 to rotate from an initial position to cause the first laser beam 31 reflected by the first reflective mirror 207 to scan along the scanning direction to sequentially bombard the (L+1)th row of droplets 22. After bombarding the (L+1)th row of droplets 22 at the irradiating position 202, the third sub-driving device 205 may drive the first reflective mirror 207 back to the original position. Then, when the (L+2)th row of droplets 22 arrive at the irradiating position 202, the second sub-driving device 206 may drive the second reflective mirror 208 to rotate from the initial position to cause the second laser beam 32 reflected by the second reflective mirror 208 to sequentially scan along the scanning direction 200 to sequentially bombard the (L+2)th row of droplets 22 at the irradiating position 202. After bombarding the (L+2)th row of droplets 22, the second sub-driving device 206 may drive the second reflective mirror 208 back to the initial position. Then, when the (L+3)th row of droplets 22 arrive at the irradiating position 202, the third sub-driving device 205 may drive the first reflective mirror 207 to rotate from an initial position to cause the first laser beam 31 reflected by the first reflective mirror 207 to sequentially scan along the scanning direction 207 to sequentially bombard the (L+3)th row of droplets 22. After bombarding the (L+3)th row of droplets 22 at the irradiating position 202, the third sub-driving device 205 may drive the first reflective mirror 207 back to the original position. Such steps may be repeated to generate continuous EUV light.

In one embodiment, the first laser beam 31 may bombard the first row of droplets 22; the second laser beam 32 may bombard the second row of droplets 22; and then the first laser beam 31 may continue to bombard the third row of droplets 22; and then the second laser beam 32 may continue to bombard the fourth row of the droplets 22, and . . . . Specifically, when the first droplet in the first row arrives at the irradiating position 202, the first reflective mirror 207 may be at the initial position. A portion of the laser beam generated by the laser source 203 may be reflected by the first reflective mirror 207 to form the first laser beam 31; and the first laser beam 31 may irradiate to the irradiating position 202 to bombard the first drop of first droplet at the irradiating position 202. Then, other droplets in the first row of droplets 22 may sequentially arrive at the irradiating position 202 with a time interval of the first time duration. Correspondingly, the first reflective mirror 207 may rotate driven by the first driving device 205. Thus, under the reflection of the first reflective mirror 207, the first laser beam 31 may scan along the scanning direction 200; and may sequentially bombard the other droplets in the first row. After the last drop of the first row of droplets 22 is bombarded by the first laser beam 31, the first reflective mirror 207 may reach a stop position; and then the first reflective mirror 207 may be driven back to the initial position by the first sub-driving device 205. When the first droplet in the second row of droplets 22 arrives at the irradiating position 202, the second reflective mirror 208 may be at the initial position. A portion of the laser beam generated by the laser source 203 may be reflected by the second reflective mirror 208 to form the second laser beam 32; and the second laser beam 32 may irradiate to the irradiating position 202 to bombard the first droplet in the second row of droplets 22 at the irradiating position 202. Then, other droplets 22 in the second row may sequentially arrive at the irradiating position 202 with a time interval of the first time duration. Correspondingly, the second reflective mirror 208 may rotate driven by the second driving device 206. Thus, under the reflection of the second reflective mirror 208, the second laser beam 32 may scan along the scanning direction 200; and may sequentially bombard the other droplets in the second row. After the last droplet in the second row of droplets 22 is bombarded by the second laser beam 32, the second reflective mirror 208 may reach a stop position; and then the second reflective mirror 208 may be driven back to the initial position by the second sub-driving device 206. Then, when the third row of droplets 22 sequentially arrive at the irradiating position 202, the first laser beam 31 may scan along the scanning direction 200 to sequentially bombard the third row of droplets 22 arriving at the irradiating position 202. After the last droplet in the third row is bombarded, the first reflective mirror 207 may rotate back to the initial position 202. Then, when the fourth row of droplets 22 sequentially arrive at the irradiating position 202, the second laser beam 32 may scan along the scanning direction 200 to sequentially bombard the fourth row of the droplets 202 at the irradiating position. After the last drop of the fourth row of droplets 202 is bombarded, the second reflective mirror 208 may be rotated back to the original position. Such steps may be repeated the last droplet in the last row of droplets 22 is bombarded.

To avoid mutual adverse effects between the first laser beam 31 and the second laser beam 32 or the adverse effects of the first laser beam 31 and/or the second laser beam 32 when the first laser beam 31 or the second laser beam 32 bombard the droplets 22, a first optical shutter 210 may be disposed between the first reflective mirror 207 and the irradiating position 202. The first optical shutter 210 may be configured to control the irradiation of the first laser beam to the irradiating position 202. Further, a second optical shutter 211 may be disposed between the second reflective mirror 208 and the irradiating position 202. The second optical shutter 211 may be configured to control the radiation of the second laser beam 32 to the irradiating position 202.

The first optical shutter 210 may include a first blocking unit (not shown) and a third driving device (not shown) connected with the first blocking unit. The second optical shutter 211 may include a second blocking unit and a fourth driving device connected with the second blocking unit. The third driving device may be configured to drive the first blocking unit to be on, or be away from the optical path of the first laser beam 31 to the irradiating position 202. The fourth driving device may be configured to drive the second blocking unit to be on, or away from the optical path of the second laser beam 32 to the irradiating position 202.

Thus, when the first laser beam 31 is bombarding the droplet 22 at the irradiating position 202, the fourth driving device may drive the second blocking unit to be on the optical path to the irradiating position 202; and the second laser beam 32 may be prevented from irradiating the irradiating position 202. When the second laser beam 32 is bombarding the droplets 22 at the irradiating position 202, the fourth driving device may drive the second blocking unit to be away from the optical path of the second laser beam 32 to the irradiating position 202; and the second laser beam 32 may irradiate the irradiating position 202. At the same time, when the second laser beam 32 is irradiating the droplets 22 at the irradiating position 202, the third driving device may drive the first blocking unit to be on the optical path of the first laser beam 31 to the irradiating position 202; and the first laser beam 31 may be prevented from irradiating the irradiating position 202. When it is the turn for the first laser beam 31 to bombard the droplets 22 at the irradiating position 202 again, the third driving device may drive the first blocking unit to be away from the optical path of the first laser beam to the irradiating position 202. Thus, the first laser beam 31 may irradiate the irradiating position 202 to bombard the droplets 22 at the irradiating position 202.

Figure 4:
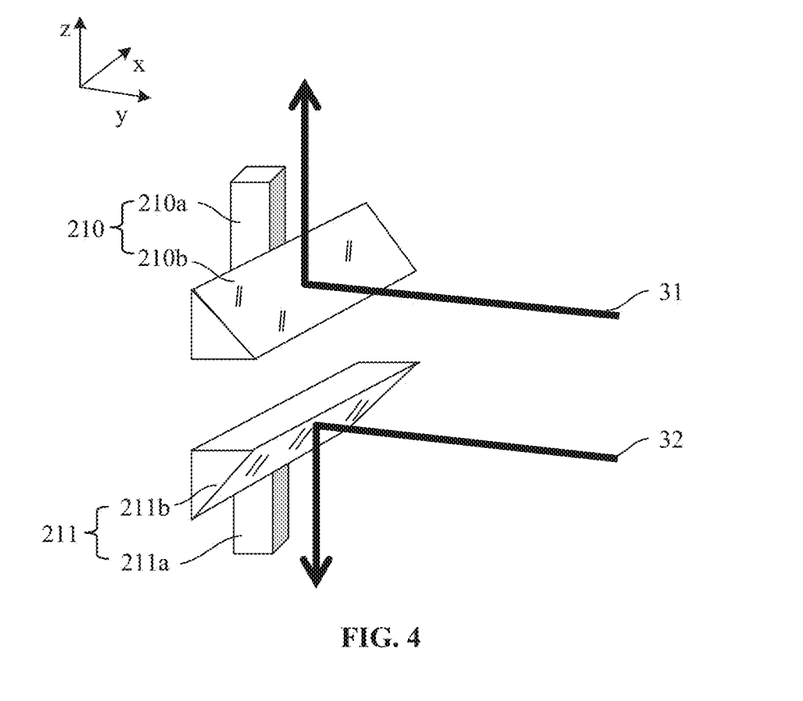

Specifically, FIG. 4 illustrates exemplary structures of a first optical shutter 210 and a second optical shutter 211 according to the disclosed embodiments. As shown in FIG. 4, the first optical shutter 210 may include a first blocking unit 210b and a third driving device 210a connected with the first blocking unit 210b; and the second optical shutter 211 may include a second blocking unit 211b and a fourth driving device 211a connected with the second blocking unit 211b. In one embodiment, the first blocking unit 210b may be a third reflective mirror. When the third reflective mirror is blocking the first laser beam 31, the third reflective mirror may reflect the first laser beam 31 to a direction away for the second optical shutter 211 (or the positive direction of the z-axis). The second blocking unit 211b may be a fourth reflective mirror. When the fourth reflective mirror is blocking the second laser beam 32, the fourth reflective mirror may reflect the second laser beam 32 to a direction away from the first optical shutter 210 (or the negative direction of the z-axis).

In certain other embodiments, the first blocking unit 210b may reflect the first laser beam 31 to the positive direction or the negative direction of the x-axis. The second blocking unit 211b may reflect the first laser beam 31 to the positive direction or the negative direction of the x-axis.

Further, a first heat recycling unit (not shown) may be disposed on the irradiating direction of the first laser beam 31 reflected by the third reflective mirror. The first heating recycling unit may be configured to absorb the first laser beam 31 reflected by the third reflective mirror. A second heat recycling unit (not shown) may be disposed on the irradiating direction of the second laser beam 32 reflected by the fourth reflective mirror. The second heating recycling unit may be configured to absorb the second laser beam 32 reflected by the fourth reflective mirror. The absorption of the reflected first laser beam 31 and the reflected second laser beam 32 may prevent the first laser beam 31 and the second laser beam 32 from being reflected again.

Further, referring to FIG. 2, the light focusing device 215 may be disposed between the reflective mirror 209 and the irradiating position 202. The light focusing device 215 may include a focusing mirror 214 and a second driving device (not labeled). The focusing mirror 214 may have an elliptical reflective surface facing the irradiating position 202. The elliptical reflective surface may collect the irradiated EUV light; and focus the collected EUV light at the central focusing point 220. The second driving device may be connected with the focusing mirror 214; and may be configured to drive the focusing mirror to perform rotating scanning. When the first laser beam 31 or the second laser beam 32 sequentially bombard the droplets 22 arriving at the irradiating position 202 to generate the irradiating EUV light, the focusing mirror 214 may collect the irradiated the EUV light; and focus the collected EUV light at the central focusing point 220.

Further, a channel 218 may be disposed at the center of the focusing mirror 214. The channel 208 may cause the laser beam reflected by the reflective mirror 209 to pass through to irradiate the droplets 22 arriving at the irradiating position 202. In one embodiment, the channel 218 is a through-hole.

In one embodiment, the focusing mirror 214 may include a first partial focusing mirror 212 and a second partial focusing mirror 213. The first partial focusing mirror 212 and the second partial focusing mirror 213 may be separated. Further, the first partial focusing mirror 212 may be disposed above the second partial focusing mirror 213. The second driving device may include a third sub-driving device 216; and a fourth sub-driving device 217. The third sub-driving device 216 may be connected with the first partial focusing mirror 212; and may be configured to drive the first partial focusing mirror 213 to perform a rotate scanning. The fourth sub-driving device 217 may be connected with the second partial focusing mirror 213; and may be configured to drive the second partial focusing mirror 213 to perform rotate scanning.

In one embodiment, the focusing mirror is separated by the plane having the central focusing point 220 and the irradiating position 202 into the first partial focusing mirror 212 and the partial focusing mirror 213. The first partial focusing mirror 212 and the second partial focusing mirror 213 may be connected with the third sub-driving device and the fourth sub-driving device by bearings, respectively. The bearing may be electromagnetic bearings, or mechanical bearings, etc.

The third sub-driving device 216 and the fourth sub-driving device 217 may include driving circuitry, power supplies, axis and bearings. The power supplies may provide power for the rotation of the first partial focusing mirror 212 and the second partial focusing mirror 213. The driving circuitry may provide drive signals to the power supplies. The power supplies may be electric motors, etc.

In one embodiment, a portion of the laser beam generated from the light source 203 may be reflected by the first reflective mirror 207 to form the first laser beam 31; and a portion of the laser beam generated from the light source 203 may be reflected by the second reflective mirror 208 to form the second laser beam 32. The first laser beam 31 and the second laser beam 32 may scan along the second direction 200 to bombard different rows of droplets 22. The third sub-driving device 216 and the second sub-driving device 217 may be able to respectively drive the top focusing mirror 212 and the bottom focusing mirror 213 to perform rotating scanning to collect the EUV light generated by the bombarding different rows of droplets 22 using the first laser beam 31 and the second laser beam 32.

Specifically, when the first laser beam 31 scans along the scanning direction 200 to bombard a certain row of the droplets 22 arriving at the irradiating position 202, the first partial focusing mirror 212 may be driven by the third sub-driving device 216 to perform rotating scanning to collect EUV light generated by bombarding the certain row of droplets 22 using the first laser beam 31; and focus the collected EUV light at the central focusing point 220. When the second laser beam 32 scans along the scanning direction 200 to bombard a next row of droplets 22 arriving at the irradiating position 202, the second partial focusing mirror 213 may be driven by the fourth sub-driving device 217 to perform rotating scanning to collect EUV light generated by bombarding the row of the droplets 22, and focus the collected EUV light at the central focusing point 220.

Specifically, when the first laser beam 31 scans along the scanning direction 200 to bombard a certain row of the droplets 22 arriving at the irradiating position 202, the first partial focusing mirror 212 may be driven by the third sub-driving device 216 to perform rotating scanning to collect EUV light generated by bombarding the certain row of droplets 22 using the first laser beam 31; and focus the collected EUV light at the central focusing point 220. When the second laser beam 32 scans along the scanning direction 200 to bombard a next row of droplets 22 arriving at the irradiating position 202, the second partial focusing mirror 213 may be driven by the fourth sub-driving device 217 to perform rotating scanning to collect EUV light generated by bombarding the row of the droplets 221, and focus the collected EUV light at the central focusing point 220.

The rotating scanning of the first partial focusing mirror 212 and the rotating scanning of the first reflective mirror 207 may be synchronized. The rotating scanning of the second partial focusing mirror 213 and the rotating scanning of the second reflective mirror 208 may be synchronized.

Further, the EUV light source may also include a control unit (not labelled). The control unit may provide synchronized first signals, second signals, and third signals. The first signals may control the spray nozzles 21 to sequentially spray droplets. The second signals may control the first driving device to drive the reflective mirror to rotate synchronically. The third signals may control the second driving device to drive the focusing mirror to rotate synchronically.

Further, the EUV light source may also include a cleaning system (not shown). The cleaning system may be configured to clean contaminations on the reflective mirror of the focusing mirror, such as the pieces generated when the droplets are bombarded.

Figure 5:
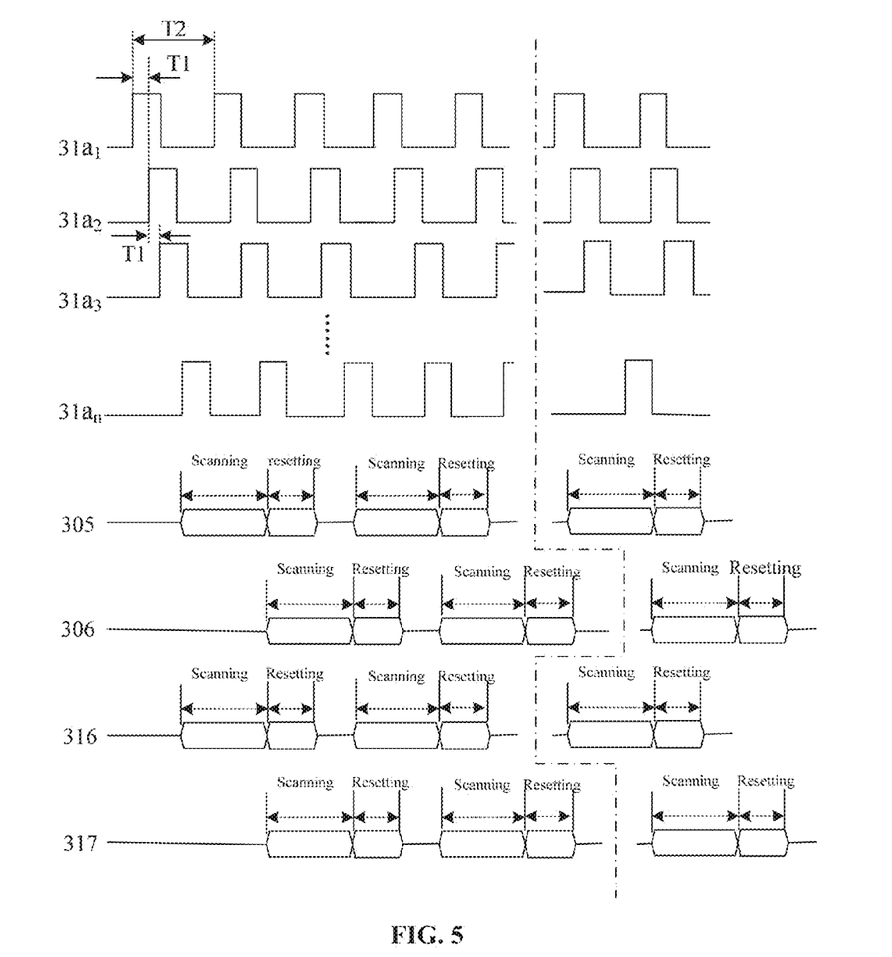
FIG. 5 illustrates control signals of an exemplary EUV light source according to the disclosed embodiments.

FIG. 5 illustrates an exemplary control signal graph according to the disclosed embodiments. As shown in FIG. 5, the first signals may include a first sub-first signal $31a_1$, a second sub-first signal $31a_2$, a third sub-first $31a_3$ . . . ; and an Nth sub-first signal $31a_n$. The second signals may include a first sub-second signal 305 and a second sub-second signal 306. The third signals may include a first sub-third signal 316 and a second sub-third signal 317.

The first signals, the second signals and the third signals may be generated from a same clock. The number of the first signals may be identical to the number of the spray nozzles 21. The first sub-first signal $31a_1$. The second sub-first signal $31a_2$, the third sub-first $31a_3$ . . . ; and the Nth sub-first signal $31a_n$ may respectively control the on/off of the switches corresponding to the first spray nozzle $21a_1$, the second spray nozzle $21a_2$, the third spray nozzle $21a_3$ . . . , and the Nth spray nozzle $21a_n$ (referring to FIG. 3). The first sub-second signal 305 may be configured to control the first sub-driving device 205 to drive the first reflective mirror 207 to rotate. The second sub-second signal 206 may be configured to control the second driving device 206 to drive the second reflective mirror 208 to rotate. The first sub-third signal 316 may be configured to control the third sub-driving device 216 to drive the first partial focusing mirror 212 to rotate. The second sub-third signal 317 may be used to control the fourth sub-driving device 217 to drive the second partial focusing mirror 213 to rotate.

Figure 6:
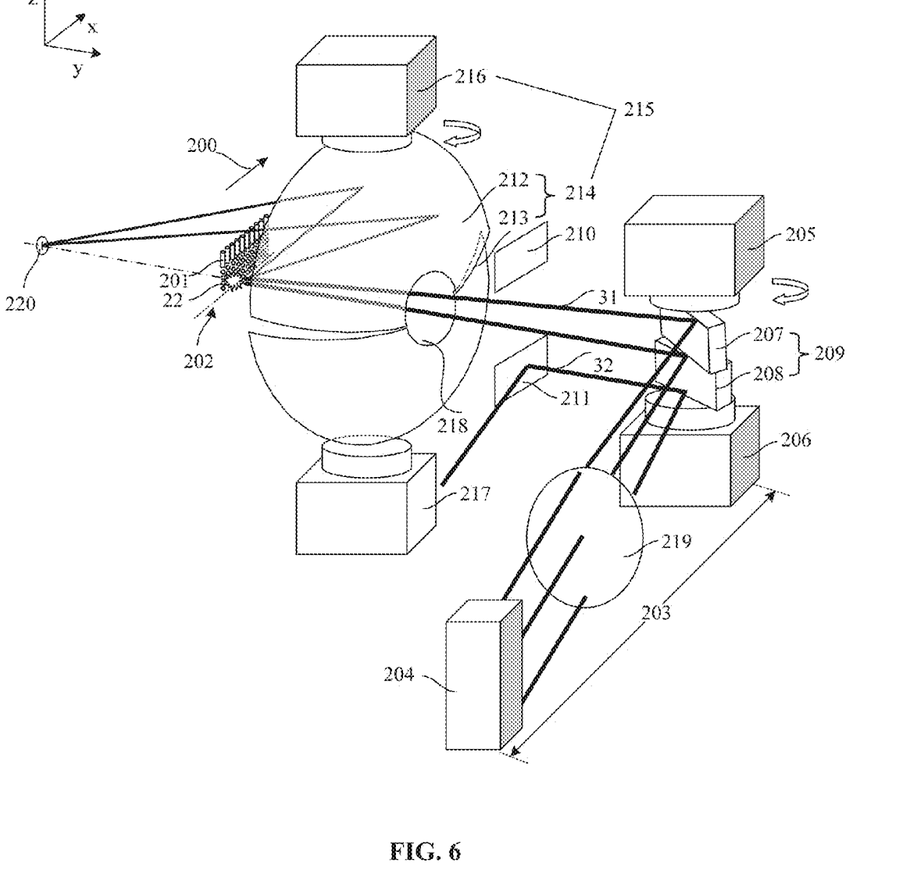
FIGS. 6-7 illustrate structures corresponding certain stages of an exemplary method for generating EUV light according to the disclosed embodiments.
Figure 7:
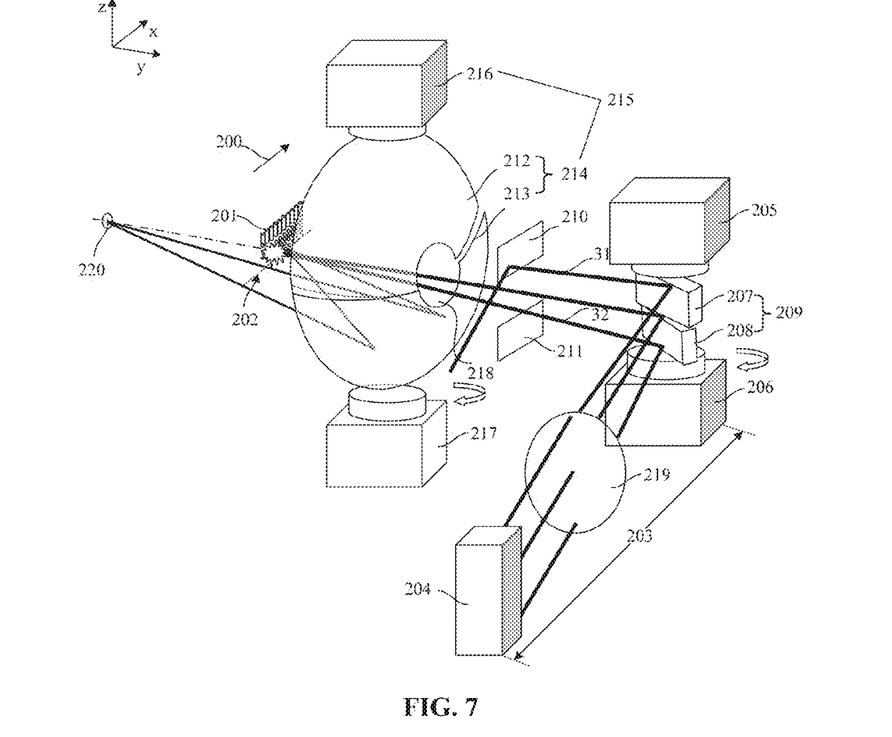

FIGS. 6-7 illustrate the structures corresponding of certain stages a method for using the EUV light source to generate EUV light according to the disclosed embodiments. The control signals illustrated in FIG. 5 may be used to control the EUV light source.

As shown in FIG. 5, the first sub-first signal $31a_1$, the second sub-first signal $31a_2$, the third sub-first $31a_3$ ..., and the Nth sub-first signal $31a_n$ may be pulse signals. The time interval between adjacent pulses may be referred as a second time T2. Further, the second sub-first signal $31a_2$ may lag behind the first sub-first signal $31a_1$ for a first time T1; the third sub-first signal $31a_3$ may lag behind the second sub-first signal $31a2$ for the first time T1; ...; and the Nth sub-first signal $31a_n$ may lag behind the (N–1)th sub-first signal $31a_{n-1}$ for the first time T1.

Further, the first signals may match a relationship of NT1=T2, wherein "N" refers to the number of the first signals (or the number of the spray nozzles 21); T1 refers to the first time; and T2 refers to the second time. Such a relationship may cause the first laser beam 31 and the second laser beam 32 to alternately bombard different rows of droplets 22 at the irradiating position 202.

Thus, when he first sub-first signal $31a_1$, the second sub-first signal $31a_2$, the third sub-first $31a_3$ ...; and the Nth sub-first signal $31a_n$ are applied on the switches corresponding to the plurality of spray nozzles 21 (the first spray nozzle 21a1, the second spray nozzle 21a2, the third spray nozzle 21a3 ..., and the Nth spray nozzle 21an illustrated in FIG. 3), the spray nozzle array 201 may sequentially spray a plurality of rows of droplets 22, such as the first row of droplets 22, the second row of droplets 22, the third row of droplets 22, ..., and the Mth (M≥3) row of droplets 22, downwardly to the irradiating position 22. Each row of droplets 22 may include a drop of first droplet sprayed by the first spray nozzle $21a_1$, a drop of second droplet sprayed by the second spray nozzle $21a_2$ lagging behind the first spray nozzle 21a, for the first time T1; a drop of third droplet sprayed by the third spray nozzle $21a_3$ lagging behind the second spray nozzle $21a_2$ for the first time T1; ...; and a drop of Nth droplet sprayed by the Nth spray nozzle $21a_n$ lagging behind the (N–1)th spray nozzle $21a_{n-1}$1 for the first time T1. Further, the time interval between adjacent rows of droplets 22 may be equal to the second time T2.

Referring to FIG. 6, before the spray nozzle array 21 sprays the droplets 22, the first reflective mirror 207 and the second reflective mirror 208 may be both at a first initial position. The first partial focusing mirror 212 and the second partial focusing mirror 213 may be at a third initial position. When the first droplet (sprayed from the first spray nozzle 21a1) arrives at the irradiating position 202, the first reflective mirror 207 may be driven by the first sub-driving device 205 to accelerate from the first initial position to a second initial position; or the second reflective mirror 208 may be driven by the second sub-driving device 206 to accelerate from the first initial position to the second initial position. When the first reflective mirror 207, or the second reflective mirror 208 is at the second initial position, the first laser beam 31 reflected by the first reflective mirror 207 or the second laser beam 32 reflected by the second reflective mirror 208 may be able to bombard the first droplet arriving at the irradiating position 202. At the same time, the first partial focusing mirror 212 or the second partial mirror 213 may be driven by the third sub-driving device 216 or the fourth sub-driving device 217 to accelerate from the third initial position to a fourth initial position. When the top focusing mirror 212 or the bottom focusing mirror 213 are at the fourth initial position, the first partial focusing mirror 212 or the second partial focusing mirror may collect the EUV light generated by bombarding the first droplet; and focus the collected EUV light at the central focusing point 202.

For illustrative purposes, the first laser beam 31 may bombard the first row of droplets 22 arriving at the irradiating position 202; and the second laser beam 32 may continue to the bombard the second row of droplets 22 arriving at the irritating position 202. The corresponding second signals and the corresponding third signals may be referred to FIG. 5. In certain other embodiments, the second laser beam 32 may be used to bombard the first row of droplets 22 arriving at the irradiating position 202; and the first laser beam 31 may be used to bombard the second row of droplets 22 arriving at the irradiating position 202.

As shown in FIG. 5, the first sub-second signal 305 may include alternative scanning stages and resetting stages. The starting point of the first scanning stage of the first sub-second signal 305 may lag behind the first pulse of the first sub-first signal $31a_1$ for a third time T3. The third time T3 may be equal to the time duration between the first spray nozzle $21a_1$ starts to spray a first drop of first droplet 22 and the first drop of first droplet 22 arrives at the irradiating position 202. The ending time of the first scanning stage of the first sub-second signal 305 may lag behind the first pulse of the Nth sub-first signal $31a_n$ for a fourth time T4. The fourth time T4 may be equal to the time duration between the Nth spray nozzle $21a_n$ starts to spry the first drop of Nth droplet 22 and the first drop of Nth droplet 22 arrives at the irradiating position 202. The first resetting stage may come right after the first scanning stage; and scanning stages and the adjacent resetting stages may have not time interval. The time of the scanning stage of the First sub-second signal 305 may be equal to the second time T2. The total time of each scanning stage and resetting stage may be smaller than two times of the second time T2. The time interval between the end of one scanning stage and the start of the adjacent next scanning stage may be equal to the second time T2.

The scanning stages of the first sub-second signal 305 may be configured to control the first sub-driving device 205 to drive the first reflective mirror 207 to rotate with a constant speed from the second initial position. The resetting stages of the first sub-second signal 305 may configured to control the first sub-driving device 205 to drive the first reflective mirror 207 to rotate back to the first initial position.

Correspondingly, the first sub-third signal 316 may include alternative scanning stages and resetting stages. The first sub-third signal 316 may be synchronized with the first sub-second signal 305. That is, the starting time and the ending time of the scanning stage and the resetting stage of the first sub-third signal 316 may be identical to the starting time and the ending time of the scanning stage and the resetting stage of the first sub-second signal 205.

The scanning stages of the first sub-third signal 316 may be used to control the third sub-driving device 216 to drive the first partial focusing mirror 212 to perform rotating scanning with a constant speed starting from a fourth initial position. The resetting stages of the first sub-third signal 316 may be used to control the third sub-driving device 216 to drive the top focusing mirror to rotate back to the third initial position.

The first sub-third signal 316 may also include an accelerating stage (not shown) before each scanning stage. The accelerating stage may be used to control the third sub-driving device 216 to drive the first partial focusing mirror 212 to accelerate from the third position to the fourth position.

Further, as shown in FIG. 5, the second sub-second signal 306 may also include alternative scanning stages and resetting stages. The starting point of the first scanning stage of the second sub-second signal 206 may lag behind the second pulse of the first sub-first signal $31a_1$ for a fifth time T5. The fifth time T5 may be equal to the time duration between the first spray nozzle 21 starts to spray a second drop of the first droplet 22 and the second drop of the first droplet 22 arrives at the irradiating position 202. The fifth time T5 may be equal to the third time T3. The ending time of the first scanning state of the second sub-second signal 206 may lag behind the second pulse of the Nth sub-first signal $31an$ for a sixth time T6. The sixth time T6 may be equal to the time duration between the Nth spray nozzle $21an$ starts to spray the second drop of the Nth droplets and the second drop of the Nth droplets arrives at the irradiating position 202. The sixth time T6 may be equal to the fourth time T4. The first resetting stage may come right after the first scanning stage; and scanning stages and the adjacent resetting stages may have not time interval. The time of the scanning stage of the second sub-second signal 206 may be equal to the second time T2. The total time of each scanning stage and resetting stage may be smaller than two times of the second time T2. The time interval between the end of one scanning stage and the start of the adjacent next scanning stage may be equal to the second time T2. Further, the staring time of the first scan stage of the second sub-second signal 206 may come right after the ending time of the first scanning stage of the first sub-second signal 305. Thus, when the first laser beam 31 finishes bombarding a certain row of droplets 22 arriving at the irradiating position 202, the second laser beam 32 may start bombarding a next row of droplets 22 arriving at the irradiating position 202 right away.

The scanning stages of the second sub-second signal 306 may be configured to control the second sub-driving device 206 to drive the second reflective mirror 208 to rotate with a constant speed from the second initial position. The resetting stages of the second sub-second signal 306 may configured to control the second sub-driving device 206 to drive the second reflective mirror 208 to rotate back to the first initial position.

Correspondingly, the second sub-third signal 317 may include alternative scanning stages and resetting stages. The second sub-third signal 317 may be synchronized with the second sub-second signal 306. That is, the starting time and the ending time of the scanning stage and the resetting stage of the second sub-third signal 317 may be identical to the starting time and the ending time of the scanning stage and the resetting stage of the second sub-second signal 306.

The scanning stages of the second sub-third signal 317 may be used to control the fourth sub-driving device 217 to drive the second partial focusing mirror 213 to perform a rotating scanning with a constant speed starting from a fourth initial position. The resetting stages of the second sub-third signal 317 may be used to control the of fourth sub-driving device 217 to drive the bottom focusing mirror 213 to rotate back to the third initial position.

The second sub-third signal 317 may also include an accelerating stage (not shown) before each scanning stage. The accelerating stage may be used to control the fourth sub-driving device 217 to drive the second partial focusing mirror 213 to accelerate from the third position to the fourth position.

As shown FIG. 6, specifically, after the spray nozzle array 21 receives the first signals $31a_1$~$31a_n$; the first sub-driving device 205 receives the first sub-second signal 305; the second sub-driving device 206 receives the second sub-second signal 306; the third sub-driving device 216 receives the first sub-third signal 316; and the fourth sub-driving device 217 receive the second sub-third signal 317, the droplet array 201 may spray a plurality of droplets 22 to the irradiating position 202, including a first row of droplets 22, a second row of droplets 22, a third row of droplets 22, . . . , and an Mth row of droplets 22. When the first droplet 22 of the first row of droplets 22 arrives at the irradiating position 202, the first sub-apparatus 205 may drive the first reflective mirror 207 to accelerate from the first initial position to the second initial position; and the first laser beam 31 may bombard the first droplet 22 arriving at the irradiating position 202. At the same time, the third sub-apparatus 216 may drive the first partial focusing mirror 212 to accelerate from the third initial position to the fourth initial position. The first partial focusing mirror 212 may collect the EUV light generated by bombarding the first droplet of the first row of droplets 22; and focus the collected EUV light at the central focusing point 220. Then, the first scanning stage of the first sub-second signal 305 may cause the first sub-driving device 205 to drive the first reflective mirror 207 to rotate with a constant speed starting from the third initial position. The first laser beam 31 may scan along the scanning direction 200 to bombard other droplets of the first row of droplets 22 sequentially arriving at the irradiating position 202. At the same time, the first scanning stage of the first sub-third signal 316 may cause the third sub-driving device 216 to drive the first partial focusing mirror 212 to rotate with a constant speed staring from the second initial position. During the rotating, the first partial focusing mirror 212 may sequentially collect the EUV light generated by bombarding other droplets 22 of the first row of droplets 22; and focus the collected EUV light at the central focusing position 220.

In one embodiment, the scanning direction 200 refers to the direction parallel to the x-axis. The rotation direction of the first reflective mirror 207 and the top focusing mirror 212 may be clock-wise under a top view.

The rotating speed of the first reflective mirror 207 may be a constant. The angular speed of the first reflective mirror 207 may be equal to the rotating angle of the first reflective mirror 207 when the first laser beam 31 bombards two adjacent droplets 22 in the first row of droplets 22 divided by the first time T1.

When the first laser beam 31 is bombarding the first droplet of the first row of droplets 22, the second optical shutter 211 may block the second laser beam 32 from irradiating the irradiating position 202.

Further, as shown in FIG. 5 and FIG. 7, after the first laser beam 31 bombards all the droplets in the first row of droplets 22, the first reflective mirror 207 may arrive a final position. The first resetting stage of the first sub-second signal 305 may cause the first sub-driving device 205 to drive the first reflective mirror 207 to rotate back to the first initial position; and to be ready for bombarding the third row of droplets 22. At the same time, the first resetting stage of the first sub-third signal 316 may cause the third sub-driving device 216 to drive the top focusing mirror 212 to rotate back to the third initial position; and to be ready to collect the EUV light generated by bombarding the third row of droplets 22.

During the process for the first partial focusing mirror 212 to rotate back to the third initial position, the first partial focusing mirror 212 may still collect and focus the EUV light. Thus, to ensure the stability of the EUV light source, the first partial focusing mirror 212 and the second partial focusing mirror 213 may be staggered during the first partial focusing mirror 212 is rotated back to the third initial position. That is, when the first partial focusing mirror 212 and the second partial focusing mirror 213 meet at a certain angle, they may all focus on the gap between adjacent droplets 22; and may not focus on a same droplet at a same time. If the first partial focusing mirror 212 and the second partial focusing mirror 213 focus on a same droplet simultaneously, the EUV light focused at the central focusing point 220 may be significantly strong, the intensity of the EUV light may have a spike, and the stability and the uniformity of the EUV light may be affected. The staggered condition between the first partial focusing mirror 212 and the second partial focusing mirror 213 may be realized by adjusting the top focusing mirror 212 to rotate back slightly ahead, or slightly behind the schedule.

Further, after the last drop of the first row of droplets 22 is bombarded; and when the first drop of the second row of droplets 22 arrives at the irradiating position 202, the second sub-driving device 206 may drive the second reflective mirror 208 to accelerate from the first initial position to the second initial position. The second laser beam 32 may bombard the first droplet of the second row of droplets 22 arriving at the irradiating position 202. At the same time, the fourth sub-driving device 217 may drive the second focusing mirror 213 to be at the first initial position; and may collect the EUV light generated by bombarding the first droplet of the second row of droplets 22. Then, the first scanning stage of the second sub-second signal 306 may cause the second sub-driving device 206 to drive the second reflective mirror 208 to rotate with a constant speed starting from the second initial position; and the second laser beam 32 may scan along the scanning direction 200 to bombard other droplets of the second row of droplets 22 sequentially arriving at the irradiating position 202. At the same time, the first scanning stage of the second sub-third signal 317 may cause the fourth sub-driving device 217 to drive the second partial focusing mirror 213 to rotate with a constant speed starting from the third initial position. During the rotation, the second partial focusing mirror 213 may sequentially collect the EUV light generated by bombarding the other droplets of the second row of droplets 22; and focus the collected EUV light at the central focusing point 220.

After the second laser beam 32 bombards all the droplets of the second row of droplets 22, the second reflective mirror 208 may arrive at a final position. The first resetting stage of the second sub-second signal 206 may cause the second sub-driving device 206 to drive the second reflective mirror 208 to rotate back to the first initial position; and to be ready for bombarding the fourth row of droplets 22 arriving at the irradiating position 202. At the same time, the first resetting stage of the second sub-third signal 317 may cause the fourth sub-driving device 217 to drive the bottom focusing mirror 213 to rotate back to the third initial position; and to be ready to collect the EUV light generated by bombarding the fourth row of droplets 22.

During the process for the second partial focusing mirror 213 being rotated back to the third initial position, the second partial focusing mirror 213 may still collect EUV light, and focus the EUV light. Thus, the second partial focusing mirror 213 and the first partial focusing mirror 212 may be staggered when the second partial focusing mirror 213 is rotated back to the third initial position. That is, when the first partial focusing mirror 212 and the second partial focusing mirror 213 meet at a certain angle, they may all focus on the gap between adjacent droplets 22; and may not focus on a same droplet at a same time. If the first partial focusing mirror 212 and the second partial focusing mirror 213 focus on a same droplet at a same time, the EUV light focused at the central focusing point 220 may be significantly strong. The staggered condition between the first partial focusing mirror 212 and the second partial focusing mirror 213 may be realized by adjusting the second partial focusing mirror 213 to rotate back slightly ahead, or slightly behind the schedule.

Such steps may repeated until the last droplet of the plurality of droplets 22 is bombarded. Thus, the intensity of the EUV light at the central focusing point 220 may be increased. The EUV light focused at the central focusing point 220 may be the output EUV light of the EUV light source.

In one embodiment, detection units, such as position sensors, or counters, etc., may be used to detect if the first reflective mirror 207, the second reflective mirror 208, the first partial focusing mirror 212 and the second partial focusing mirror 213 have arrived the initial positions and final positions. The detected signals from the detection units may be feedback to the corresponding driving device to adjust the drive process of the first reflective mirror 207, the second reflective mirror 208, the first partial focusing mirror 212 and the second partial focusing mirror 213.

Figure 8:
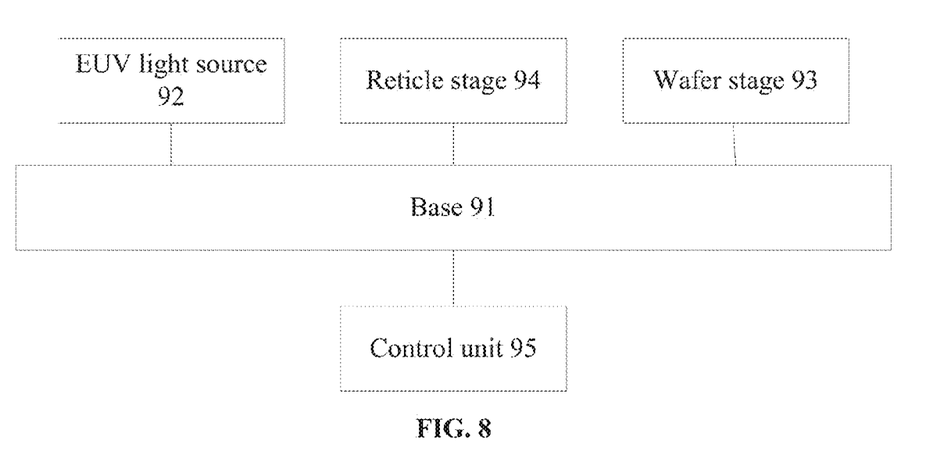
FIG. 8 illustrates a block diagram of an exemplary exposure apparatus according to the disclosed embodiments.

Thus, an exposure apparatus is provided according to the disclosed embodiments. The exposure apparatus may comprise the disclosed EUV light source; and other aspects of the present disclosure. The EUV light source may be used as a light source when the exposure apparatus is used to perform a photolithography process. FIG. 8 illustrates a block diagram of an exemplary exposure apparatus according to the disclosed embodiments.

As shown in FIG. 8, the exposure apparatus may include a base 91. The base 91 may be used to support other components of the exposure apparatus. The exposure apparatus also includes an EUV light source 92. The EUV light source 92 may be the disclosed EUV light source; and may be configured as an exposure light source for a photolithography process. Further, the exposure apparatus may also include a wafer stage 93. The wafer stage 93 may be configured to hold a wafer for forming patterns by the photolithography process. Further, the exposure apparatus may also include a reticle stage 94. The reticle stage 94 may be configured to hold a reticle (not shown) for the photolithography process. Further, the exposure apparatus may also include a control unit 95. The control unit 95 may be configured to control the exposure apparatus to perform the photolithography process.

Figure 9:
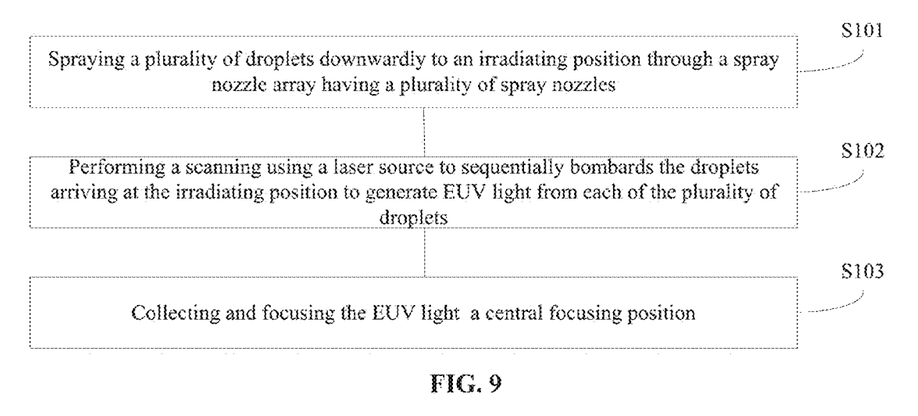
FIG. 9 illustrates an exemplary method for generating EUV light according to disclosed embodiments.

Further, a method for generating EUV light using is also provided according to the disclosed embodiment. FIG. 9 illustrates a corresponding flow chart for generating EUV light using the disclosed exposure apparatus. As shown in FIG. 9, the method may include spraying a plurality of droplets downwardly to an irradiating position through a spray nozzle array having a plurality of spray nozzles (S101); performing a scanning using a laser source to sequentially bombard the droplets arriving at the irradiating position to generate EUV light from each of the plurality of droplets (S102); and collecting and focusing the EUV light at a central focusing point (S103).

According to the disclosed embodiments, the disclosed EUV light source may include a spray nozzle array, and the spray nozzle array may include a plurality of spray nozzles. The plurality of spray nozzles may sequentially spray a plurality of rows of droplets downwardly to an irradiating position. Thus, the number of droplets supplied per unit time may be increased. Further, because each row of droplets aligned along a scanning direction may be sprayed out by different spray nozzles, the adjacent droplets may have a desired distance. Further, because the laser beam may scan along the scanning direction to sequentially bombard the plurality of droplets arriving at the irradiating position to generate EUV light, all the droplets arriving at the irradiating position may be bombarded by the laser beam; and the quantity of the generated EUV light may be increased. At the same time, the focusing mirrors may perform rotating scanning to simultaneously collect the EUV light generated by bombarding different droplets, and focus the collected EUV light at the central focusing point. The output power of the EUV light at the central focusing point may be increased.

Further, the reflective mirror of the disclosed EUV light source may include a first reflective mirror and a second reflective mirror. The first driving device of the disclosed EUV light source may include a first sub-driving device and a second sub-driving device. The first reflective mirror may be disposed above the second reflective mirror. The first reflective mirror may reflect a portion of the laser beam to form a first laser beam. The first sub-driving device may be connected with the first reflective mirror to drive the first reflective mirror to rotate. When the first reflective mirror is rotating, the first laser beam may scan along a scanning direction. The second reflective mirror may reflect a portion of the laser beam to form a second laser beam. The second sub-driving device may be connected with the second reflective mirror to drive the second reflective mirror to rotate. When the second reflective mirror is rotating, the second laser beam may scan along a scanning direction. Thus, the first laser beam and the second laser beam may alternately bombard the droplets to generate EUV light; and the power of the EUV light may be increased.

Further, the second apparatus of the disclosed EUV light source may include a third sub-driving device and a fourth sub-driving device. The third sub-driving device may be connected with a first partial focusing mirror, and configured to drive the first partial focusing mirror to perform a rotating scanning. The fourth sub-driving device may be connected with a second partial apparatus; and configured to drive the second partial focusing mirror to perform rotating scanning. Thus, the first laser beam and the second laser beam may be able to alternately bombard adjacent rows of droplet. The corresponding first partial focusing mirror may collect the EUV light generated by the first laser beam; and focus the EUV light at the central focusing point. The corresponding second partial focusing mirror may collect the EUV light generated by the second laser beam and focus the collected EUV light at the central focusing point. Thus, the power of the EUV light at the central point may be further increased. That is, the power of the EUV light source may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An extreme ultraviolet (EUV) light source, comprising:
a spray nozzle array having a plurality of spray nozzles configured to spray a plurality of rows of droplets to an irradiating position;
a laser source having a first reflective mirror and a second reflective mirror configured to generate a first laser beam and a second laser beam and cause the first laser beam and the second laser beam to sequentially bombard the plurality of droplets arriving at the irradiating position to generate EUV light with increased output power, and
a light focusing device comprising a first partial focusing mirror and a second partial focusing mirror configured to perform a rotating scanning to collect EUV light and focus the collected EUV light at a central focusing point.

2. The EUV light source according to claim 1, wherein the laser source further comprises:
a laser configured to generate the laser beam;
a reflective mirror configured to reflect the laser beam to cause the laser beam to irradiate the irradiating position; and
a first driving device connected with the reflective mirror and configured to cause the reflected laser beam to scan along a scanning direction to sequentially bombard the droplets arriving at the irradiating position.

3. The EUV light source according to claim 1, wherein:
the first driving device includes a first sub-driving device and a second sub-driving device;
the first reflective mirror is disposed above the second reflective mirror;
the first sub-driving device is connected to the first reflective mirror to drive the first reflective mirror to scan along the scanning direction; and
the second sub-driving device is connected to the second reflective mirror to drive the second reflective mirror to scan along the scanning direction.

4. The EUV light source according to claim 1, wherein the laser beam further comprises:
a first laser beam; and
a second laser beam.

5. The EUV light source according to claim 1, wherein:
distances between centers of adjacent spray nozzles are identical.

6. The EUV light source according to claim 4, wherein:
a size of the droplet is in a range of approximately 25 µm~35 µm; and
the distance between the centers of adjacent spray nozzles is in a range of approximately 45 µm~75 µm.

7. The EUV light source according to claim 1, wherein:
the droplets are made of one of Sn, Sn alloy, Sn compound, Xe and Li.

8. The EUV light according to claim 3, further including:
a control unit configured to output synchronized first signals, second signals, and third signals,
wherein the first signals control the plurality of spray nozzles to sequentially spray droplets; the second signals control the second driving device to drive the reflective mirrors to synchronically rotate; and the third signals controls the first driving device to drive the focusing mirror synchronically rotate.

9. The EUV light source according to claim 2, wherein:
the laser is a $CO_2$ laser.

10. The EUV light source according to claim 2, further comprising:
a through channel at the center of the reflective mirror configured to cause the laser beam reflected by the reflective mirror to go through to bombarding the droplets arriving at the irradiating position.

11. The EUV light source according to claim 2, the light focusing device further includes:
a focusing mirror disposed between the reflective mirror and the irradiating position configured to collect EUV light and focus the collected EUV light at the central focusing position; and
a second driving device connected with focusing mirror to cause the focusing mirror to perform a rotating scanning.

12. The EUV light source according to claim 11, wherein:
the first partial focusing mirror is disposed above the second partial focusing mirror,
the second driving device includes a third sub-driving device and a fourth sub-driving device;
the third sub-driving device is configured to drive the first partial focusing mirror to perform a rotating scanning; and the fourth sub-driving device is configured to drive the second partial focusing mirror to perform a rotating scanning.

13. A method for generating EUV light, comprising:
spraying a plurality of droplets downwardly to an irradiating position through a spray nozzle array having a plurality of spray nozzles;
performing a scanning using a laser beam including a first laser beam and a second laser beam reflected by a first reflective mirror and a second reflective mirror to sequentially bombard the droplets arriving at the irradiating position to generate EUV light from each of the plurality of droplets; and
collecting and focusing the EUV light at a central focusing point with an increase output power using a light focusing device comprising a first partial focusing mirror and a second partial focusing mirror.

14. The method according to claim 13, wherein:
the plurality of spray nozzles include three or more spray nozzles distributed along the scanning direction.

15. The method according to claim 14, wherein spraying the plurality of droplets
downwardly to an irradiating position further includes:
sequentially spraying a first drop of first droplet through each of the plurality of spray nozzles.

16. The method according to claim 15, wherein:
the plurality of the first drops of first droplets form a first row of droplets; and
a first laser beam and a second laser beam of the light source sequentially each of the first droplets in the first row of droplets arriving the irradiating position.

17. The method according to claim 16, further including:
spraying a second drop of droplet from each of the plurality of spray nozzles lagging behind with the corresponding first drop of droplet with a time interval of second time.

18. The method according to claim 15, wherein:
the plurality of droplets sprayed from the plurality of spray nozzles form a plurality of rows of droplets.

19. An exposure apparatus, comprising:
a base,
an EUV light source comprising a plurality of spray nozzles for sequentially spraying a plurality of droplets and a light focusing device comprising a first partial focusing mirror and a second partial focusing mirror configured as a exposure light source for a photolithography process;
a wafer stage configured to hold a wafer for forming patterns by the photolithography process;
a reticle stage for holing a reticle for the photolithography process; and
a control unit configured to control the exposure apparatus to perform the photolithography process.

20. The exposure apparatus according to claim 19, wherein:
the plurality of droplets are alternately bombarded by a first laser beam and a second laser beam reflected by a first reflective mirror and a second reflective mirror to generate EUV light with increased output power.

* * * * *